United States Patent [19]

Kuboyama et al.

[11] Patent Number: 5,014,012
[45] Date of Patent: May 7, 1991

[54] D.C. BIASING APPARATUS

[75] Inventors: Yoichi Kuboyama; Koichi Yanagawa, both of Hachiojishi, Japan

[73] Assignee: Hewlett-Packard Co., Palo Alto, Calif.

[21] Appl. No.: 374,117

[22] Filed: Jun. 30, 1989

[30] Foreign Application Priority Data

Jul. 6, 1988 [JP] Japan .................................. 63-167910

[51] Int. Cl.$^5$ ............................................. G01R 27/00
[52] U.S. Cl. ....................................... 324/720; 324/649
[58] Field of Search ............... 324/649, 654, 658, 684, 324/691, 720, 650, 57 R, 713, 715

[56] References Cited

U.S. PATENT DOCUMENTS 3,378,765  4/1968  Hilsenrath et al. .................. 324/658
3,519,923  7/1990  Martin ................................ 324/684
4,467,275  8/1984  Maeda et al. ....................... 324/713

FOREIGN PATENT DOCUMENTS 142471  7/1986  Japan ................................. 324/649

Primary Examiner—Kenneth Wieder
Assistant Examiner—Maura K. Regan

[57] ABSTRACT

For measuring the inductance of a workpiece, a device which includes an inductance meter, respective D.C. and A.C. power sources as well as a guard line circuit. In order to simulate conditions of actual use of the workpiece, the D.C. power source is connected to provide a direct current bias through the workpiece. A measuring current produced by the A.C. power source and applied to the workpiece is detected via the inductance meter. The guard line circuit is coupled so as to prevent any portions of the A.C. measuring signal from undesirably flowing through the D.C. power source.

4 Claims, 8 Drawing Sheets

D.C. BIASING APPARATUS

BACKGROUND OF THE INVENTION

1. Industrial Field

The present invention relates to a D.C. biasing apparatus in impedance measurement, and more particularly to an apparatus for applying a D.C. bias current in inductance measurement.

2. Prior Art and Problems thereof

An inductor has a different inductance value depending on a D.C. bias current because of causes such as saturation of a magnetic core. Accordingly, when inductance is measured under a similar condition as the actual employment state of the device, a D.C. bias power source is used together with an ordinary inductance meter. A problem existing in such measurement is that an error is produced in impedance measurement because an A.C. measuring signal undesirably flows through the D.C. bias power source which is connected in parallel to the device under test.

Here, a conventional method for measuring inductance under D.C. bias will be explained with reference to the drawings. First, one of conventional examples is to connect an inductor 74 having sufficiently large inductance as compared with the device under test between a bias power source and the device under test as shown in FIG. 7 (a). An impedance measuring equipment 71 is a general measuring instrument with which a value of a device under test is determined by applying an A.C. current to a device under test 72 from terminals $H_c$ and $L_c$, measuring A.C. voltages at terminals $H_p$ and $L_d$ and obtaining a vector ratio thereof. Here, a current $i_{ac}$ from the terminal $H_c$ is divided at the terminal $H_d$ flowing in the device under test 72 and a current $i_e$ flowing to the bias power source. The shunt ratio at this time is determined principally by the ratio of the impedance of the device under test 72 to the inductor 74. The current $i_e$ flows into the terminal $L_c$ of the impedance measuring equipment through the capacitor C and the power source E. Since processing is performed in the measuring instrument 71 assuming that a current $(i_d + i_e)$ flew in the device under test 72, an error is produced in a measured value. In order to reduce this error, it is just required to reduce $i_e$. For such a purpose, it is required to make the inductance of the inductor 74 very large for the device under test. For example, when it is desired to take the measurement within an error of 10% in case the true impedance of the device under test is 1KΩ (approximately 1.6 H) at the measuring frequency of 100 Hz, the inductor 74 requires 16 H or more which is 10 times as high as the true impedance. Further, a current of the same value as the D.C. current which is desired to be applied to the device under test 72 flows in this inductor 74. Therefore, when the bias current is 10 A for instance, the inductor 74 which has a large inductance value as described above becomes huge physically.

As another method, it is thinkable that a parallel resonance circuit 76 is provided in place of the inductor 74 as shown in FIG. 7 (b). At the resonance frequency, the impedance looking the D.C. bias source from the connecting point of terminals $H_c$ and $H_p$ and the device under test becomes very large. Therefore, highly accurate measurement can be made, but the measurement frequency is limited to the resonance frequency, thus lacking in universality.

Hereupon, there is another problem in the D.C. biasing method. FIG. 8 (a) shows an external appearance of the system. Said system 81 includes an inductance measuring unit 81 and a D.C. bias power source unit 82, and a device under test is connected to a measurement terminal 84 attached directly to or in the vicinity of the power source unit 82 so as to be measured.

However, it is desirable to extend and connect a prober 85 with cables as shown in FIG. 8 (b) in order to improve workability in some measurement environment, but a new problem is caused by extension cables. The bias current flows out of a power source 83 and flows in a bias cable 88A as shown with an arrow mark $I_1$ and flows further in a bias cable 88B through a device under test of the prober 85 and returns to the power source 83 again as shown with an arrow mark $I_2$. With this, two problems arise with such a composition. The first problem is that a capacitance is formed between bias cables 88A and 88B. If it is assumed for instance that these two connecting cables are parallel conductors as shown in FIG. 9 (a), the capacity between conductors, viz., the capacity C between bias cables is formularized approximately by the following expression.

$$C = \frac{\pi O}{I_n} \; (D/r)(F/m)$$

$$O = 8.854 \times 10^{-12} (F/m)$$

The measured signal of the inductance meter expands the measurement error with the coupling (AC coupling) thereof through this capacity C. For example, the capacity between cables when the bias cables 88A and 88b in the length of 1 (m) are held close to each other (D = 2 r) is approximately 40 pF, and this means that, when impedance of 1 KΩ is measured with the measurement frequency of 1 MHz, a stray impedance of approximately 4 KΩ is added in parallel, thus producing a measurement error of about 20%. Moreover, since this capacity greatly depends on the distance between cables, two lines of cables 88A and 88B have to be fixed in some configuration in order to improve measurement reproducibility, which makes the workability worse.

The second problem is a magnetic field generated by bias currents $I_1$ and $I_2$. The magnetic field produced at a point at a distance a from bias cables is formularized as follows:

$$\text{magnetic flux density} = \frac{\mu O^J}{2\pi a} \; (Wb/m^2)$$

$$\mu O = 4\pi \times 10^{-7} (H/m)$$

In some cases, such apparatus does not satisfy the product standard because of the reason that magnetic field makes trouble for other instrument. For instance, when a bias current of 20 (A) is applied, the magnetic field produced at a point at a distance of 1 cm from the cables is $B = 4 \times 10^{-4}$ (Wb/m²) per cable, viz. 4 gauss. Furthermore, the magnetic field of 2 times as high as the case of a line of cable, viz., 8 gauss is produced at the point P shown in FIG. 9.

Against above-mentioned problems, when respective cables 88A and 88B are shielded by a shield 91 as shown in FIG. 9 (b), it is possible to prevent the generation of a capacity between cables, but the magnetic field cannot be prevented from being generated.

Also, if a coaxial cable 93 is used as shown in FIG. 9 (c), the bias current flows in a core wire 93a and a casing 93b in the opposite directions, respectively. Therefore, no magnetic field is produced on an outside of the cable. On the contrary, however, the capacity between the core wire 93a and the casing 93b becomes large.

Problems to Be Solved by the Invention

It is an object of the present invention which has been made for the purpose of removing above-said drawbacks of the prior art to eliminate the necessity of using a large inductance for cutting off an alternating current, to aim at with this miniaturization and cost reduction of the device, and to improve the measurement accuracy greatly in impedance measurement under D.C. bias and particularly in inductance measurement. It is another object to make it feasible to maintain high measurement accuracy without depending on the measurement frequency over all measurement frequencies. It is still another object to make it feasible to extend from an impedance measuring equipment and a D.C. bias power source to a fixture by using cables without deteriorating the measurement accuracy. Furthermore, it is another object to prevent the magnetic flux generated by a large D.C. bias current. Moreover, it is another object to make it feasible to use an impedance measuring equipment in which an ordinary impedance measuring equipment is used, and among others, a four-terminal pair method which is superior as the connecting method may be used. Also, it is another object to constitute a measuring system in which no modification is made on the impedance measuring equipment at all.

SUMMARY OF THE INVENTION

Means to Solve the Problems

In conclusion, according to the present invention (the first invention), there is provided a D.C. biasing apparatus which applies D.C. bias to a device under test for measuring impedance thereof, characterized in that:

there are provided at least one impedance unit connected between one terminal of said device under test and a connecting point and at least one impedance unit connected between said connecting point and another terminal of said device under test;

at least one of said impedance units is a D.C. bias power source; and said connecting point is connected to a connecting line for removing effects on impedance measurement of an A.C. measuring current which flows in other than said device under test such as a guard line and a shield line.

Also, according to the present invention (the second invention), there is provided a D.C. biasing apparatus which applies D.C. bias to a device under test for measuring impedance thereof, characterized in that:

there are provided a first impedance unit connected to a first end portion of a first round trip line and a second impedance unit connected to a first end portion of a second round trip line;

at least one of said first impedance unit and said second impedance unit is a D.C. bias power source;

a second end portion of one line of said first round trip line is connected to one terminal of said device under test, and a second end portion of one line of said second round trip line is connected to another terminal of said device under test; and the second end portion of another line of said first round trip line and the second end portion of another line of said second round trip line are connected with each other, and connected further to a connecting line for removing effects on impedance measurement by an A.C. measuring current flowing in other than said device under test such as a guard line, a shield line and the like.

Further, according to the present invention (the third invention), there is provided a D.C. biasing apparatus according to said second invention, characterized in that said first round trip line and said second round trip line are coaxial cables.

BRIEF DESCRIPTION OF THE DRAWINGS

FIG. 1 is an electric circuit diagram showing a D.C. bias application equipment according to the first embodiment;

FIG. 2 is a perspective view showing the external appearance of this first embodiment;

FIG. 3 is an electric circuit diagram of the final stage of the D.C. bias current source according to the first embodiment;

FIG. 4 is an electric circuit diagram for explaining the principle of the present invention;

FIG. 5 is an electric circuit diagram according to the second embodiment;

FIG. 6 is an electric circuit diagram according to the third embodiment;

DESCRIPTION OF THE PREFERRED EMBODIMENTS

Embodiments

Figure 7A:
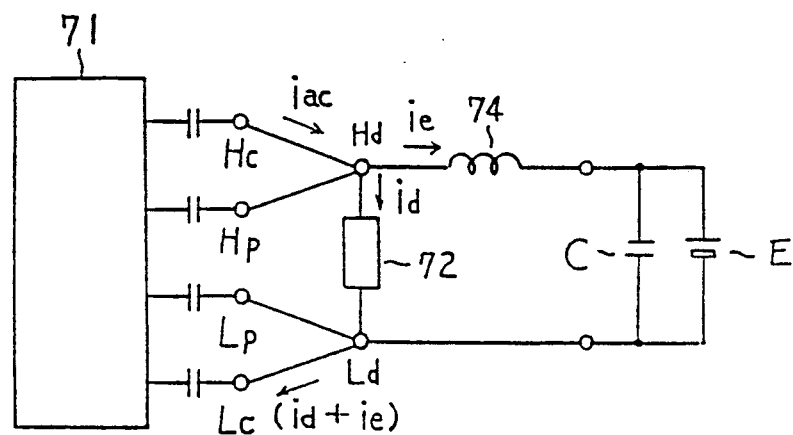
FIG. 7a–7b is an electric circuit diagram showing a conventional measuring method.
Figure 7B:
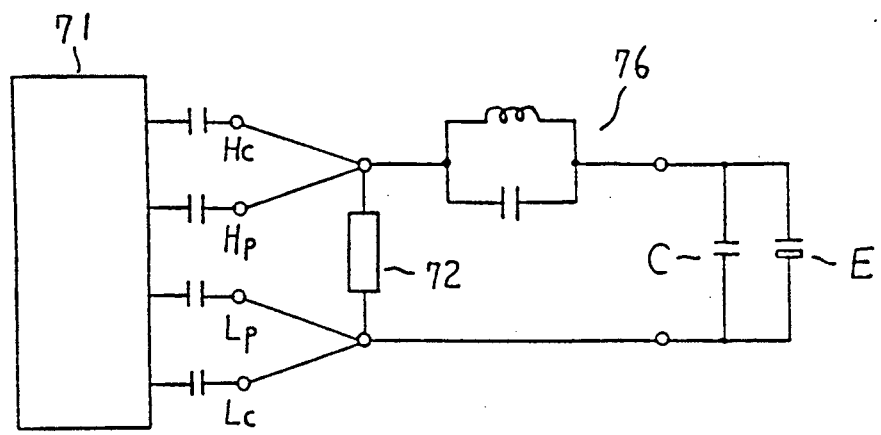

The present invention will be described hereinafter with reference to embodiments shown in the drawings. First, the principle of the present invention will be explained based on a circuit diagram shown in FIG. 4. An impedance measuring equipment 41 is the same as the impedance measuring equipment 71 which was described in a conventional example shown in FIG. 7. Two sets of D.C. bias power sources 43A and 43B that are examples of the impedance units are connected to an inductor 42 which is a device under test, and a D.C. bias current $I_{DC}$ is supplied by means of these D.C. bias power sources 43A and 43B. On the other hand, a measurement signal current $i_{ac}$ from a terminal Hc of the impedance measuring equipment is divided at the ratio of the impedance of the device under test 42 to the impedance of power sources 43A and 43B (mainly the impedance of an inductor $L_1$) at a terminal $H_d$, and a current $i_d$ flows in the device under test and a current $i_b$ flows on the side of the power sources. Then, $i_b$ flows through a capacitor $C_1$ or a voltage source $E_1$ and is divided at a connecting point G into a current $i_{b1}$ which flows into a guard line 45 and a current $i_{b2}$ which flows to the side of the power source 43B. This $i_{b2}$ causes to produce an error in a measured value in the same manner as the conventional example shown in FIG. 7. Here, when attention is paid to the shunt ratio of $i_{b1}$ to $i_{b2}$, this shunt ratio is determined approximately by the ratio of the impedance $Z_G$ of the guard 45 to the impedance of an inductor $L_2$, and $Z_G$ may be made essentially a value close to almost $0\Omega$ in a practical device. Therefore, it is possible to set at $i_{b2}/i_{b1}=0$ (viz. $i_{b2}=0$). Accordingly, the current flowing into $L_c$ becomes $i_d+i_{b2})=i_d$, thus making it possible to realize bias application with very small error. For example, when the impedance of the device under test is 1 K$\Omega$ and the impedance of $L_1$ and $L_2$ is both 100 $\Omega$ at the measurement frequency, $i_{b2}/i_{b1}=10-3$ is obtained even if the guide impedance $Z_G=10$ m$\Omega$. Thus, the error caused by the D.C. bias power source becomes 0.1%. Furthermore, since the guide impedance $Z_G$ does not depend on the frequency, $(i_{b2}/i_{b1})=0$ is obtained over a wide frequency range.

Figure 4:
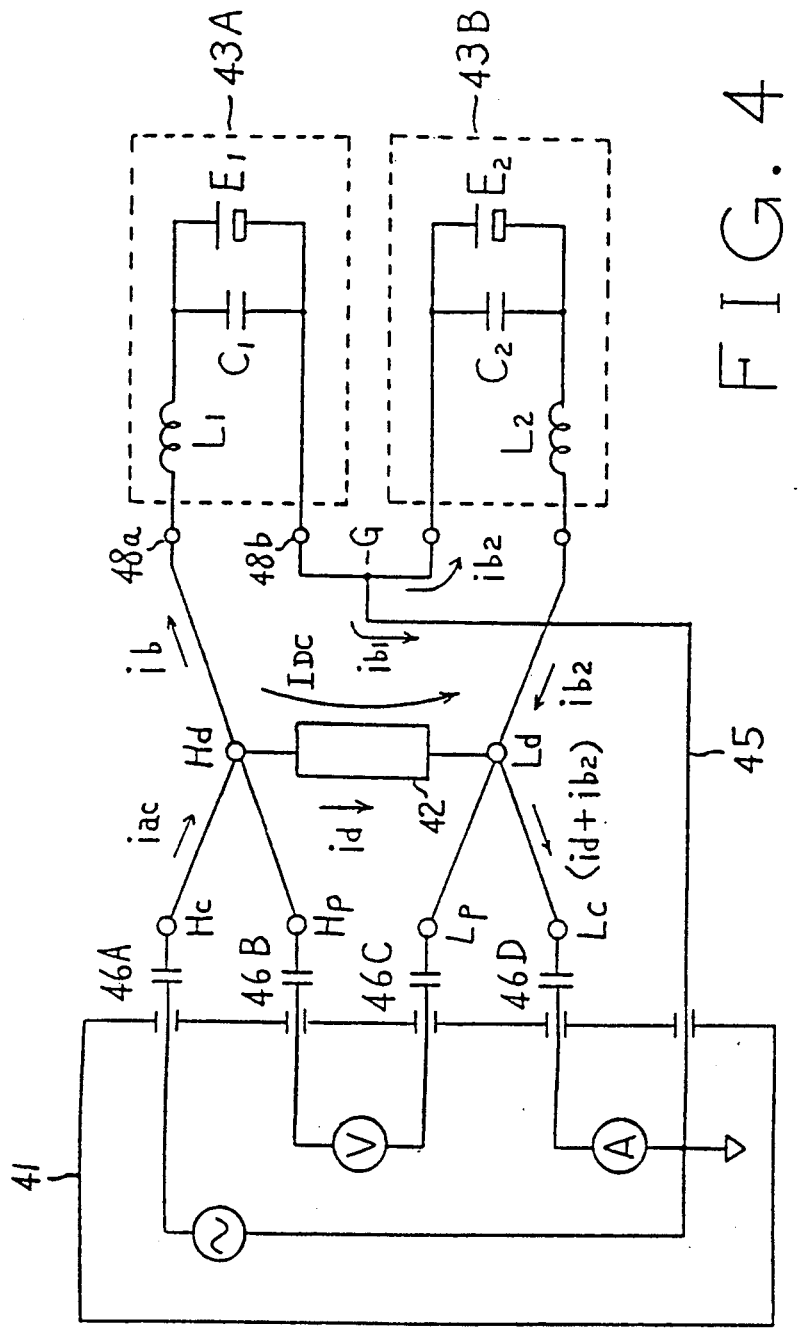

Besides, it has been described in the explanation of the principle with reference to FIG. 4 that the bias power source circuit is composed of an inductor, a capacitor and a voltage source, but it is not limited to this composition as a matter of course. For example, such compositions that, a resistor is used in place of the inductor, a current source is used in place of the voltage source, or the capacitor is not used, or a current source only is used may be considered as alternatives.

Furthermore, it has been described in FIG. 4 that two bias power source circuits are connected in series. However, this is not limitative, but it is only required that at least one of two impedance units is a bias power source circuit. For example, only an inductor and a resistor may be connected to terminals 48a and 48b in place of the bias power source 43A. Otherwise, a case in which the voltage of the voltage source $E_1$ or $E_2$ is zero (V) may be considered. What is important is that series connection is made and to obtain a sufficiently large shunt ratio at a common connecting point where the guard is connected between a plurality of impedance units in which at least one of them is a D.C. bias power source, and it will be apparent to those skilled in the art that various modifications are feasible. However, the applicant considers that it is the best to connect current sources in series. Therefore, a current source will be shown in embodiments hereafter.

Here, marks used in the accompanying drawings are mentioned in addition. The components expressed with those marks do not necessarily mean ideal ones, for example, a current source having an impedance $\infty$ for a current source, but practical devices are expressed with simplification for the convenience of illustration. Similarly, conductors in the accompanying drawings include a portion meaning resistance 0 in the equivalent circuit expression and a portion meaning inclusion of small impedance as symbols of actual wires and cables. Such discrimination will be understood easily by those skilled in the art from the whole intent of the present specifications.

Figure 5:
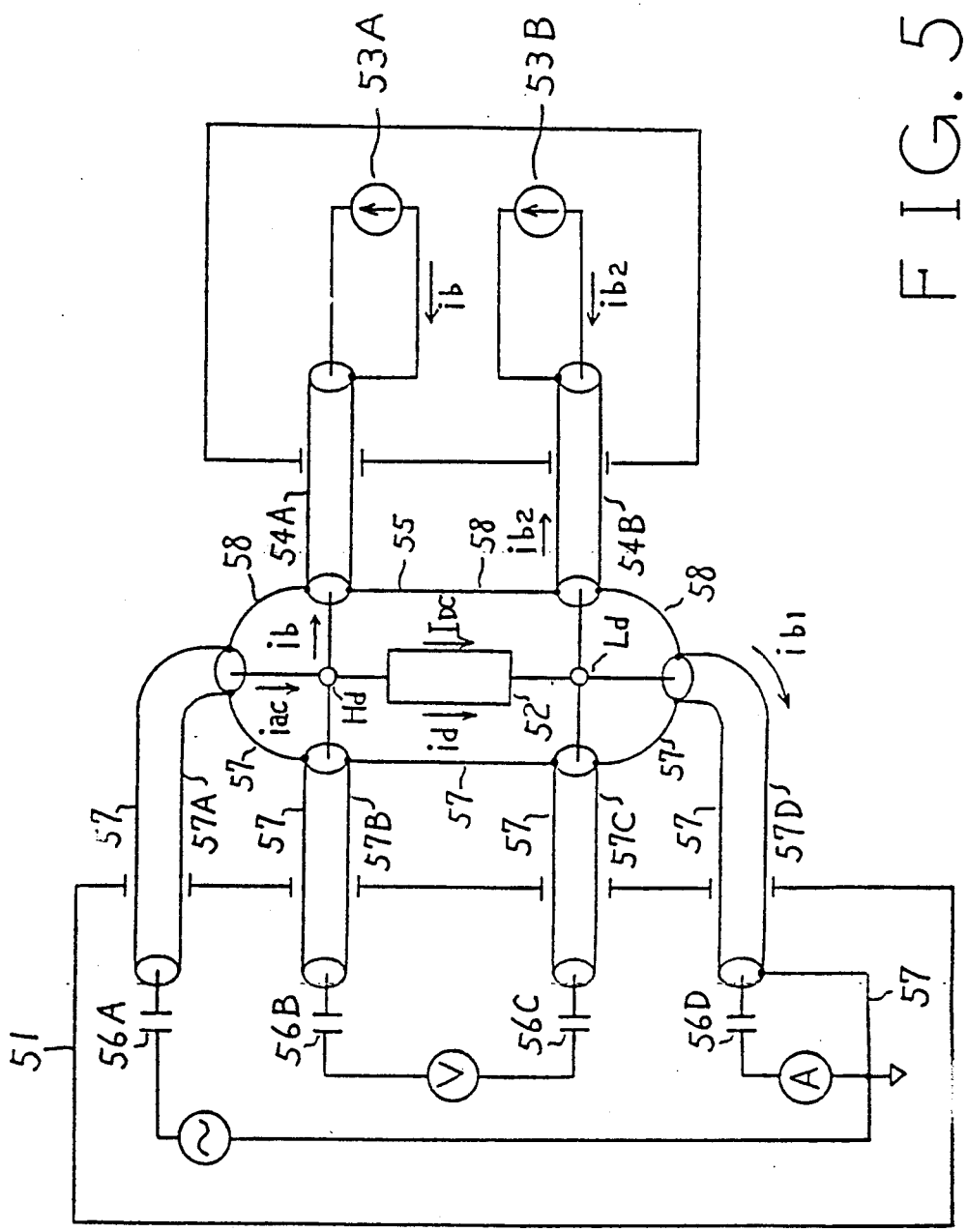

In the next place, the feature of the present invention will be explained in more details with reference to an embodiment shown in FIG. 5. In the Figure, an impedance measuring equipment 51 and a device under test 52 that are connected by what is called five-terminal method are shown. Cables for supplying current to the device under test 52 and cables for measuring the voltage of the device under test 52 are guarded by shields (guards) 57A thru 57D, respectively, and the current by a stray capacity flows through these guards and has no influence on the measured value, which is effective for high impedance measurement. Two sets of bias current sources 53A and 53B are connected to the device under test 52 by coaxial cables 54A and 54B. External conductors of coaxial cables 54A and 54B are connected with each other by a conductor 55, and these are connected further to the guard 57 by a conductor 58. A D.C. bias current $I_{DC}$ passes one after another from a bias current source 53A through, a core wire of the coaxial cable 54A, the device under test 52, a core wire of the coaxial cable 54B, the bias current source 53B, a casing wire of the coaxial cable 54B, the conductor 55, a casing wire of the coaxial cable 54A and the bias current source 53A.

On the other hand, an A.C. measurement signal $i_{ac}$ is divided into $i_b$ and $i_d$ at the terminal $H_d$, and $i_b$ is divided further into a current $i_{b1}$ flowing to the side of the guard 57 and a current $i_{b2}$ flowing to the side of the power source 53B through the conductor 58. In the similar manner as the above-mentioned explanation, this shunt ratio is determined by the impedance ratio of the circuit, thus $i_{b12}=0$ is obtained. Since $i_b$ flows mostly to the guard 57, only the current $i_d$ flowing in the device under test 52 is detected at the current detector of the impedance measuring equipment 51. Here, it is noticeable that, since the connection distance between the casing lines of coaxial cables 54A and 54B and the guard 57 may be shortened, that is, the length of the conductor 58 may be shortened, it is possible to make the shunt ratio of $i_{b1}$ to $i_{b2}$ very large.

Figure 1:
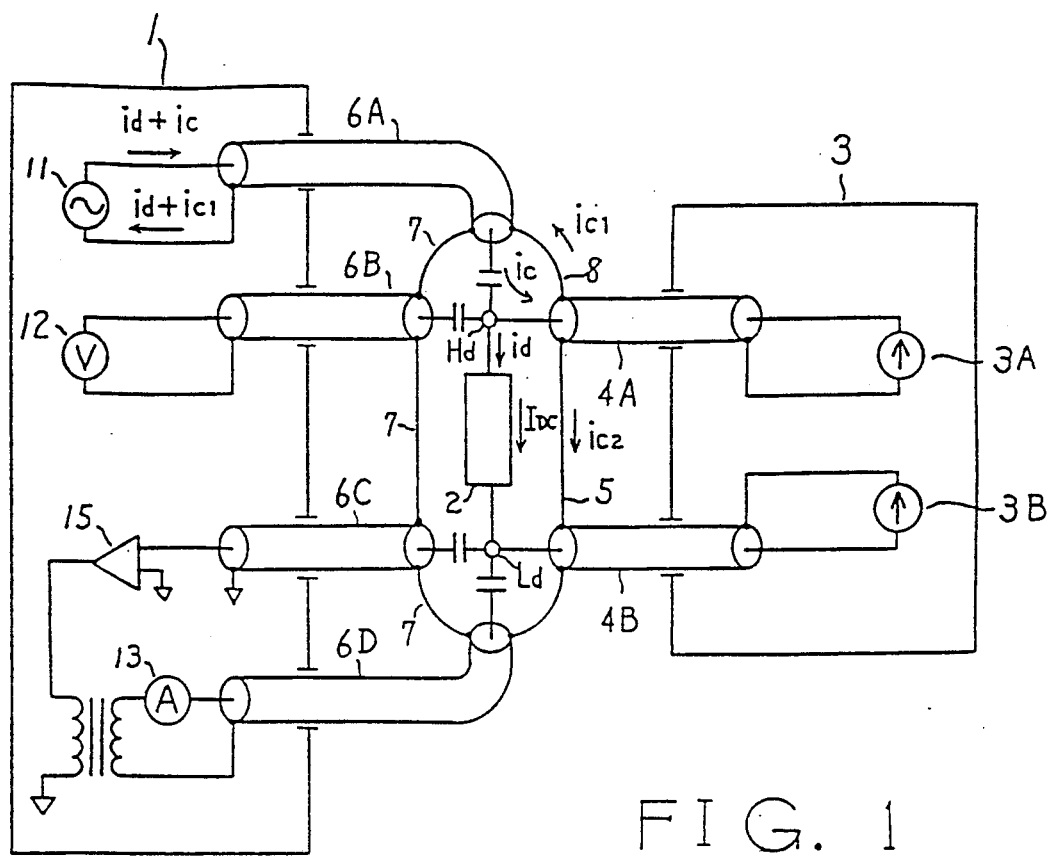
FIG. 1 thru FIG. 6 relate to embodiments according to the present invention.

In the next place, an embodiment which the applicant considers the best will be explained. FIG. 1 shows an application of the present invention in impedance measurement by a four-terminal pair method. A measuring current flows to a device under test (DUT) 2 from an A.C. power source 11 through a central conductor of a coaxial cable 6A and passes an ammeter 13. External conductors of the coaxial cable 6D and the coaxial cable 6A form a return circuit of this current. If the balance of currents in the onward circuit and the return circuit has been obtained, magnetic fluxes produced by the central conductor and the external conductor of the coaxial cable are negated each other, thus measurement errors caused by the mutual inductance between coaxial cables may be avoided. When the above-said balance is lost, an error current flows in a zero potential detection amplifier 15 connected to a terminal $L_d$ of the device under test 2, and fed back to the side of the ammeter 13 until the amplified error current becomes zero. With this, the potential difference between the terminal $L_d$ and the external conductors of coaxial cables 6C and 6B becomes zero. Therefore, the voltage between the terminal $L_d$ and the terminal $H_d$ is measured by a voltmeter 12. D.C. bias power sources 3A and 3B and the device under test 2 are connected in an almost similar manner as the embodiment shown in FIG. 5. However, attention is to be paid to that 57 shown in FIG. 5 is used as a shield wire and the conductor 58 makes connection with this shield, whereas the coaxial cable 6A is for applying same currents in opposite direction to the central conductor and the external conductor, respectively, and the conductor 8 is for returning the current which flows out of the central conductor to the external conductor.

Figure 2:
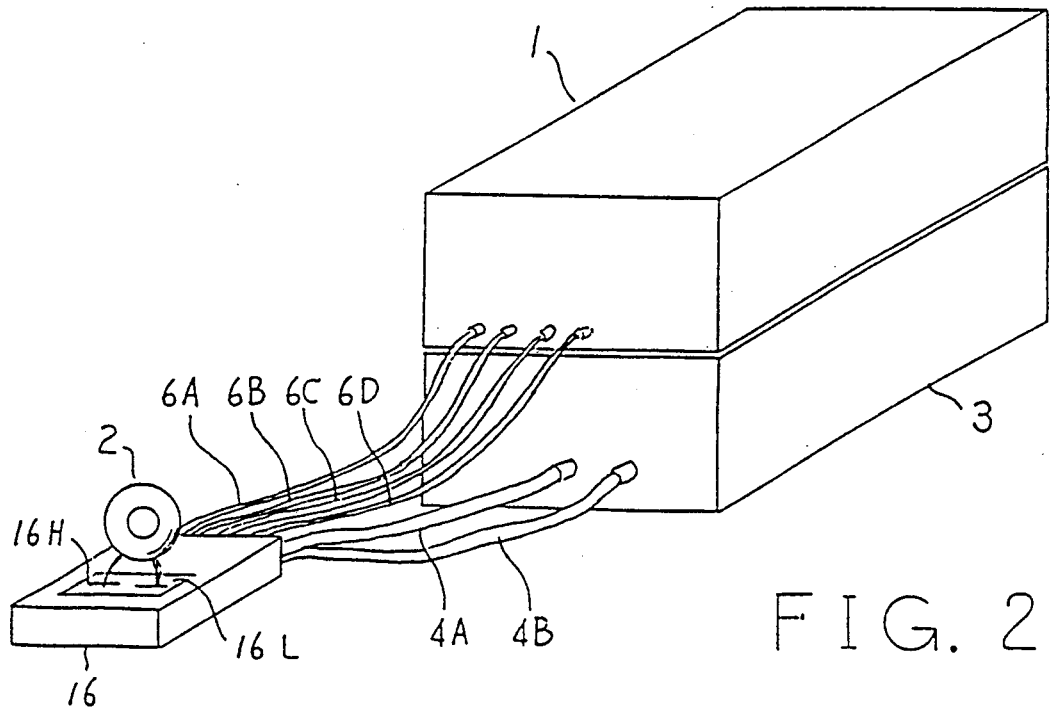

FIG. 2 shows an external appearance of a system applied with the embodiment shown in FIG. 1. A test fixture 16 is provided with a contact 16H for the terminal $H_d$ and a contact 16L for the terminal [$H_L$] $L_d$, which are connected to central conductors of cables 6A thru 6D through D.C. cutoff capacitors. Also, the connection between the coaxial cable 4A and the coaxial cable 6A with a conductor 8 is made in the test fixture 16.

Figure 3:
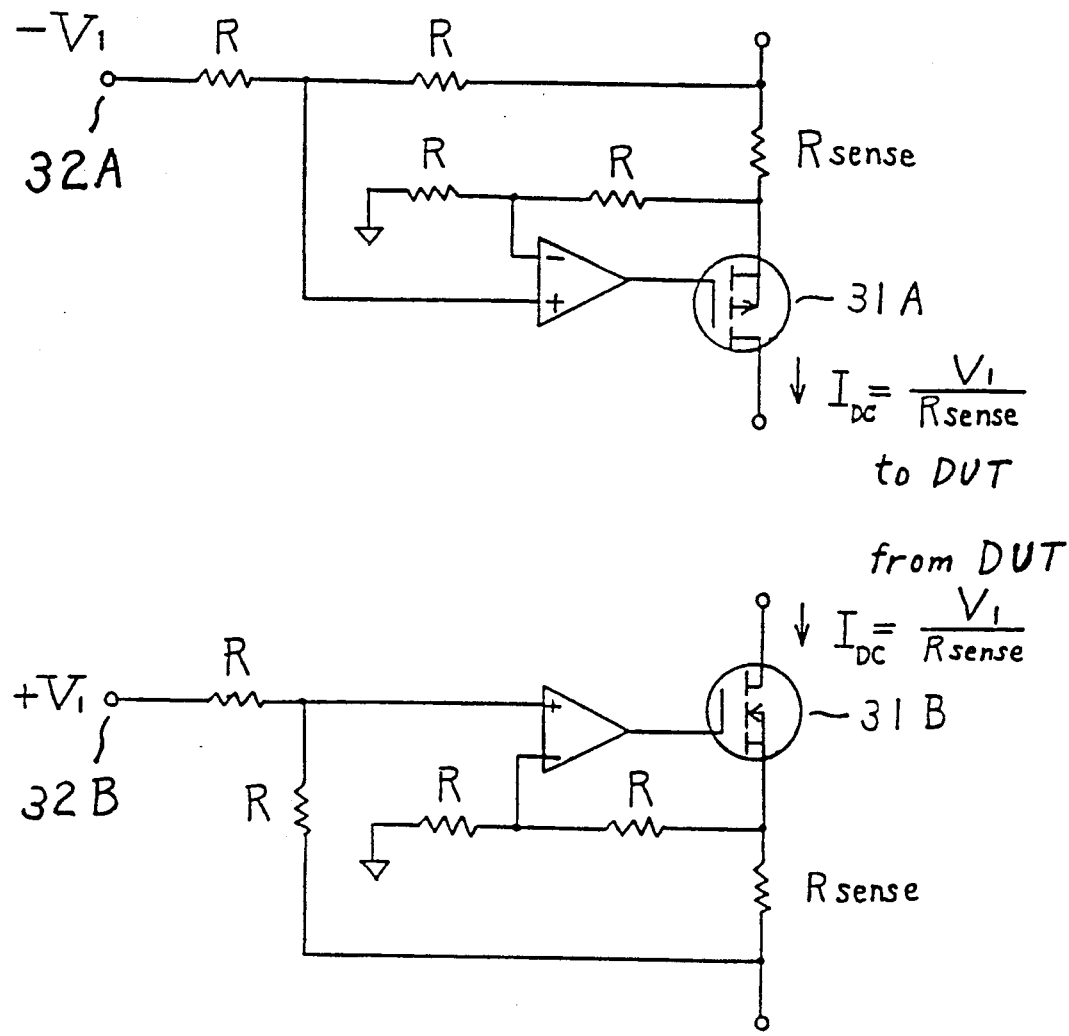

FIG. 3 shows circuit diagrams of the last stage of the power source units constituting the power sources 3A and 3B. 31A and 31B denote power-MOSFETS. To control voltage input terminals 32A and 32B, control voltage having an equal absolute value and polarities opposite to each other are applied by a control voltage generating circuit (not shown) which may be constituted by prior art. The amplitude of the D.C. bias current is obtained as follows.

$$I_{DC} = V_1/R_{sense}$$

Next, the operation of the embodiment shown in FIG. 1 and FIG. 2 will be explained. The D.C. bias current flows from the current source 3A one after another through the path of a central conductor of the cable 4A → the device under test → a central conductor of the cable 4B → the current source 3B → the external conductor of the cable 4B → a conductor 5 → the external conductor of the cable 4A → the current source 3A. Since the amplitudes of the currents flowing respectively in central conductors and external conductors of the coaxial cables 4A and 4B are equal to each other, no magnetic flux is produced outside of the cables.

An A.C. measurement signal from the power source 11 is divided partially as a current $i_c$ at the terminal $H_d$, which flows to the central conductor of the cable 4A. The current which has returned in the external conductor of the cable 4A through the reactance such as the capacity between the central conductor and the external conductor of the cable 4A through the reactance such as the capacity between the central conductor and the external conductor of the cable 4A is divided into a current $i_{c1}$ of the conductor 8 and a current $i_{c2}$ of the conductor 5. However, the impedance on the side of the conductor 5 looking from the dividing point is very large as compared with that on the side of the conductor 8. That is, while the conductor 5 is connected to the power source 3B, the conductor 8 is connected directly to the external conductor of the cable 6A, and moreover, is connected in the fixture 16. Therefore, the conductor 8 itself is very short. With this, the following expressions are obtained.

$$i_{c2} = 0$$

$$i_{c1} = i_c$$

Since only the A.C. measurement signal $i_d$ flowing in the device under test 2 is measured with the ammeter 13, accurate measurement can be made without being affected by $i_c$ at all.

In the above-mentioned embodiment, it has been described that a common connecting point between two current sources connected in series through two pairs of round trip lines is connected to the guard in the vicinity of the device under test. However, it is not necessarily limited to such description, but it is possible to be extended comparatively long from the common connection point between two bias power sources. Also, a coaxial cable may not necessarily be used for the cable for D.C. bias supply, but a single wire or parallel wires may be used when generation of the magnetic field causes no problem. Further, a D.C. cutoff capacitor is provided between the impedance measuring equipment and both terminals of the device under test in the above embodiment. The location of this capacitor may be in the fixture in the vicinity of the device under test as shown in FIG. 1, or outside of the impedance measuring equipment 41 or in the vicinity thereof as shown in FIG. 4. Also, in an impedance measuring equipment 5 provided with D.C. cutoff capacitors 56A thru 56D as shown in FIG. 5, these capacitors may be utilized. However, the D.C. cutoff capacitor is not necessarily indispensable for an embodiment according to the present invention.

Figure 6:
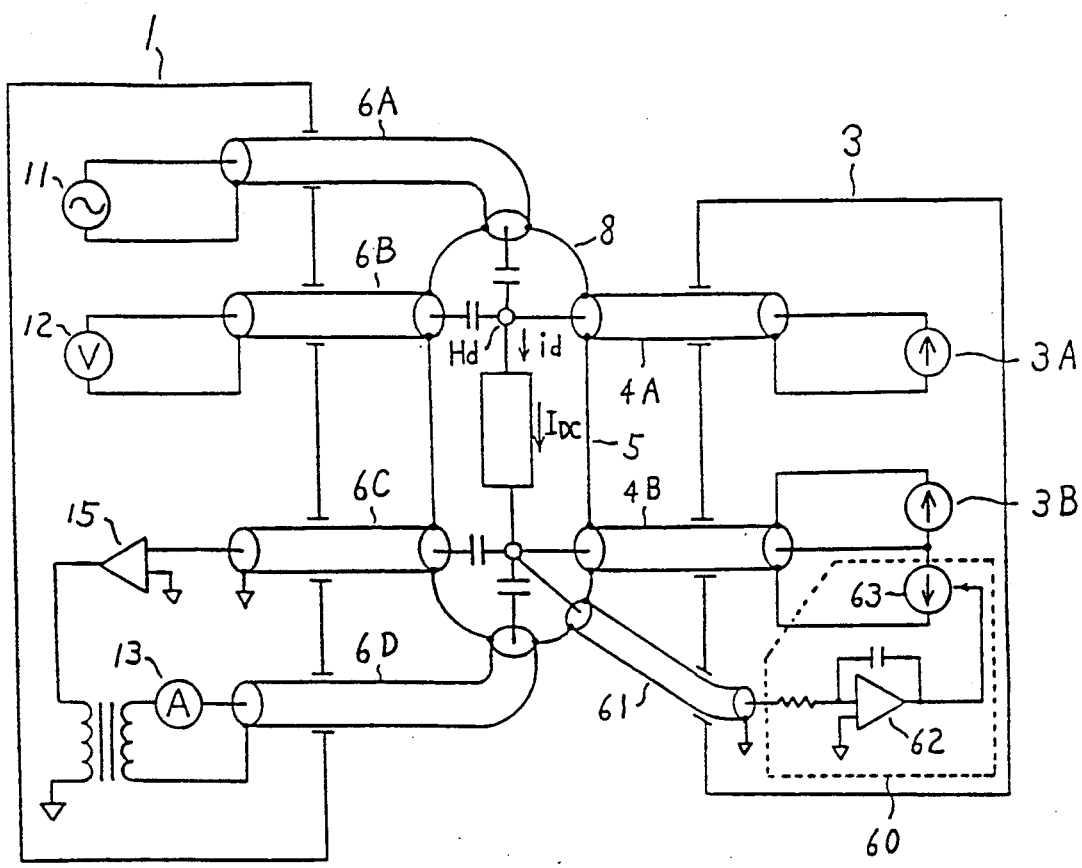

Further, another embodiment is shown in FIG. 6. The same components as those in the embodiment shown in FIG. 1 are affixed with the same marks, and detailed explanation is omitted. In this embodiment, a protective circuit 60 is provided in addition to the embodiment shown in FIG. 1. If any difference is produced temporarily in the amplitudes of currents of the D.C. bias power sources 3A and 3B, an excessive burden is imposed on the equipment, thus causing a fear to break or deteriorate the measuring equipment and so forth. The protective circuit 60 is provided for the purpose of equalizing the D.C. current flowing into the terminal $H_d$ to the D.C. current drawn from the terminal $L_d$, and is composed of what is called active inductance circuit. 63 denotes a control power source. Its circuit diagram is shown in FIG. 6. With this, it is arranged so as to control the current drawn from the terminal $L_d$ corresponding to the D.C. potential of the terminal $L_d$.

Figure 8A:
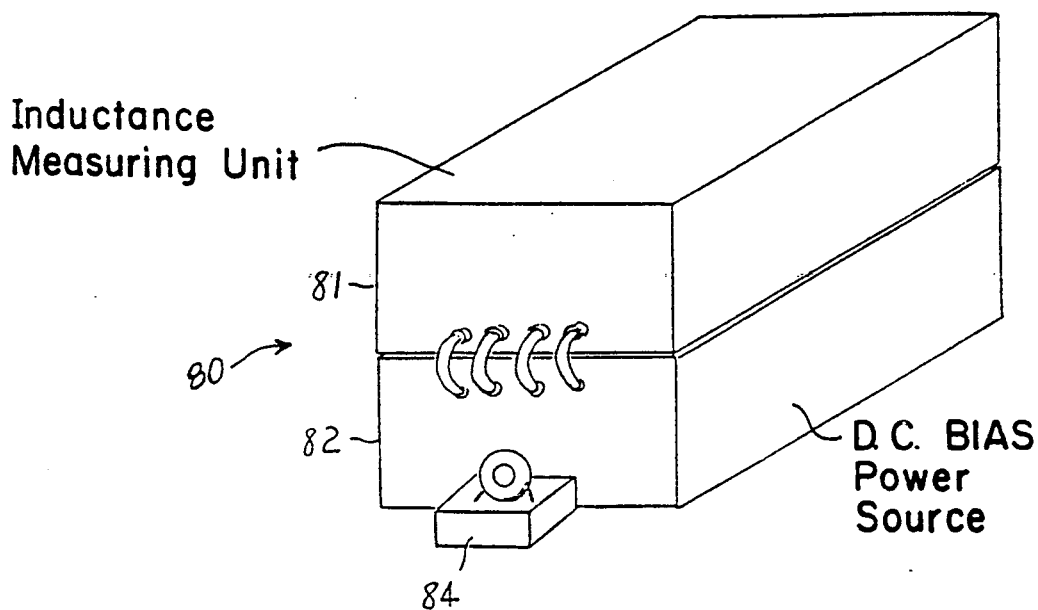
FIG. 8 is a perspective view showing an external appearance of the conventional example shown in FIG. 7.
Figure 8B:
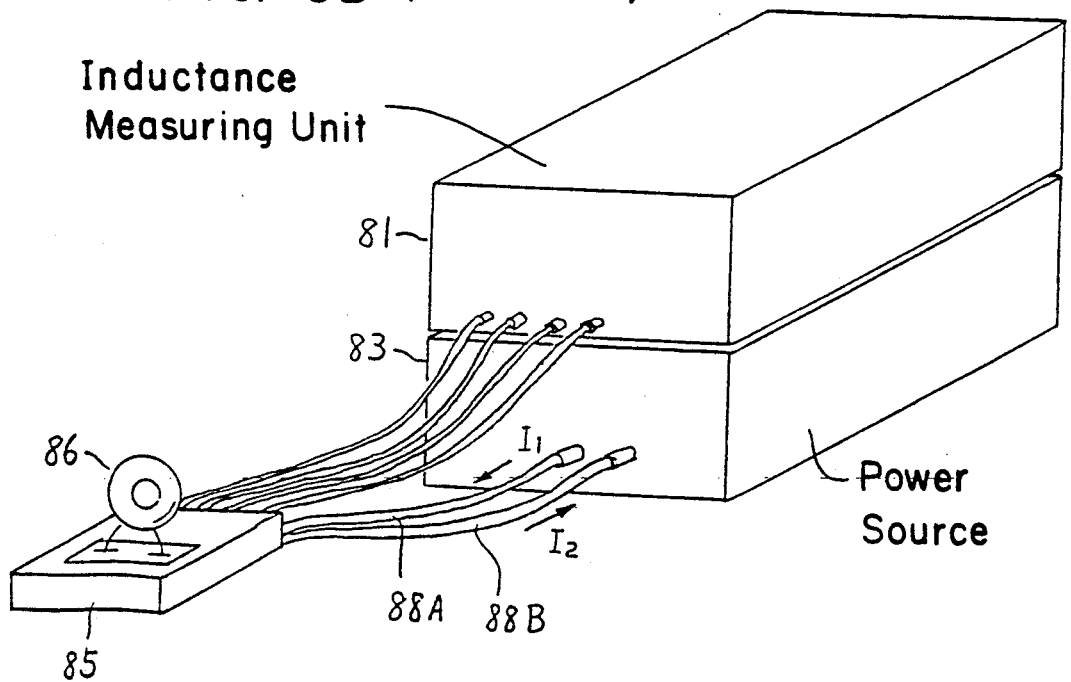
Figure 9A:
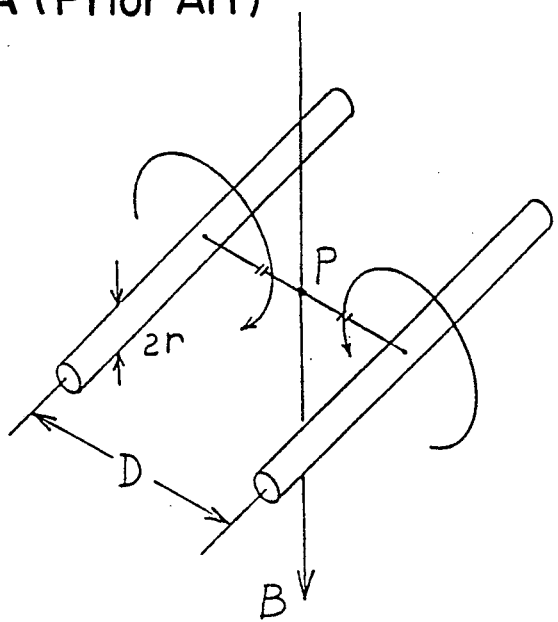
FIG. 9a–9c is a perspective view of cable for explaining problems of a conventional example.
Figure 9B:
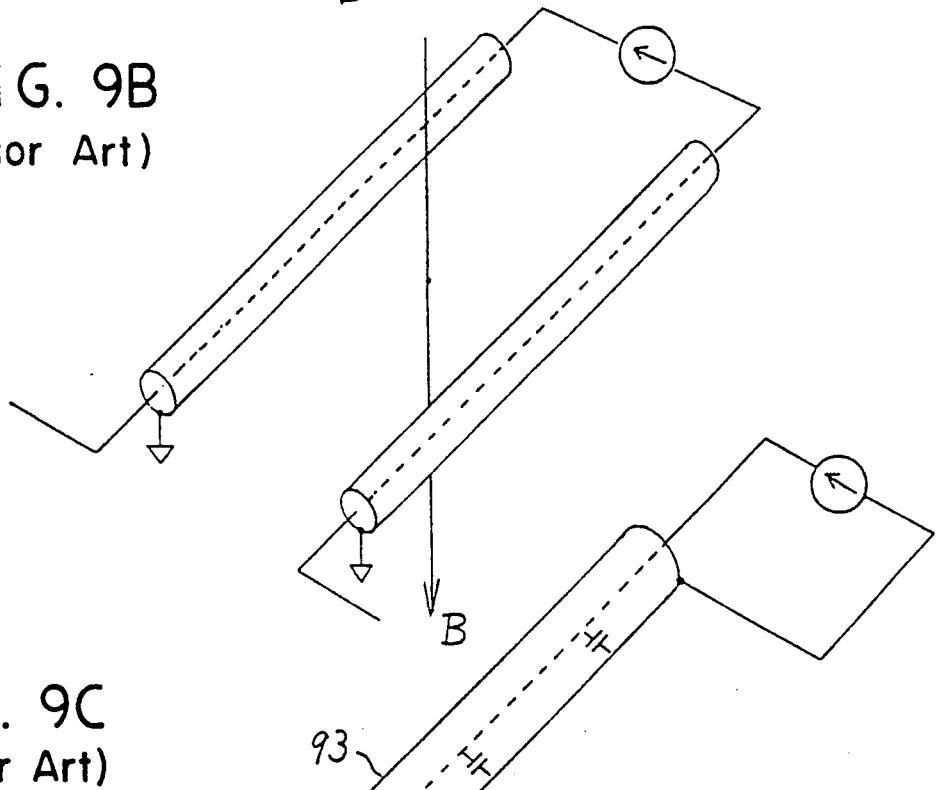
Figure 9C:
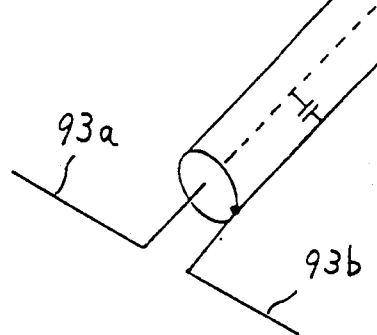

Embodiments of the present invention have been explained as described above, but it is needless to say that the present invention is not necessarily applied only to the case that extension is made with cables from the D.C. bias power source to the device under test. For example, it will easily be realized that noticeable results are obtainable when it is applied to a system such as shown in FIG. 8 (a).

Effects

Since the present invention is constituted and operated as described above, it is no longer required to use a large inductor for cutting off A.C. in impedance measurement and more particularly in inductance measurement under D.C. bias, thus the equipment is miniaturized and the measurement accuracy is improved remarkably. Also, it is possible to maintain a high measurement accuracy without depending on the measurement frequency over all the measurement frequencies. Furthermore, it is possible to extend from the impedance measuring equipment and the D.C. bias power source to the fixture by using cables without lowering measurement accuracy. Also, the magnetic flux is prevented from generating from cables supplied with D.C. bias current. Also, the present invention may be applied to the application of the D.C. bias current in impedance measurement by a four-terminal pair method. Moreover, a measuring system may be provided without modifying the impedance measuring equipment at all.

These and other modifications to and variations upon the described embodiments are provided for by the present invention, the scope of which is limited only by the following claims.

What is claimed is:

1. A D.C. biasing apparatus which applies D.C. bias to a device under test for measuring impedance thereof, characterized in that:
   there are provided at least one impedance unit connected between one terminal of said device under test and a connecting point and at least one impedance unit connected between said connecting point and another terminal of said device under test;

at least one of said impedance units is a D.C. bias power source; and said connecting point is connected to a guard line for removing effects on impedance measurement of an A.C. measuring current which flows in other than said device under test.

2. A D.C. biasing apparatus which applies D.C. bias to a device under test for measuring impedance thereof, characterized in that:

there are provided a first impedance unit connected to a first end portion of a first round trip line and a second impedance unit connected to a first end portion of a second round trip line;

at least one of said first impedance unit and said second impedance unit is a D.C. bias power source;

a second end portion of one line of said first round trip line is connected to one terminal of said device under test, and a second end portion of one line of said second round trip line is connected to another terminal of said device under test; and the second end portion of another line of said first round trip line and the second end portion of another line of said second round trip line are connected with each other, and connected further to a guard line for removing effects on impedance measurement by an A.C. measuring current flowing in other than said device under test.

3. A D.C. biasing apparatus according to claim 2, characterized in that said first round trip line and said second round trip line are coaxial cables.

4. A D.C. biasing apparatus according to any of claims 1, 2 or 3, characterized in that the connecting line for removing the effects on impedance measurement by the A.C. measuring current flowing in other than said device under test is an external conductor of a coaxial cable in a four terminal pair connection method.

* * * * *